(12) United States Patent
Chan et al.

(10) Patent No.: US 6,800,516 B2
(45) Date of Patent: Oct. 5, 2004

(54) ELECTROSTATIC DISCHARGE DEVICE PROTECTION STRUCTURE

(75) Inventors: Yi-Ling Chan, Meo-Li (TW); Fu-Liang Yang, Hsin-Chu (TW); Yi Ming Sheu, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 12 days.

(21) Appl. No.: 10/348,387

(22) Filed: Jan. 21, 2003

(65) Prior Publication Data
US 2004/0140505 A1 Jul. 22, 2004

(51) Int. Cl.[7] .............................................. H01L 21/336
(52) U.S. Cl. ...................................... 438/197; 257/355
(58) Field of Search ........................... 438/197; 257/355

(56) References Cited

U.S. PATENT DOCUMENTS

| | | | | |
|---|---|---|---|---|
| 4,356,623 A | * | 11/1982 | Hunter | 438/305 |
| 5,360,749 A | | 11/1994 | Anjum et al. | 437/24 |
| 5,477,409 A | * | 12/1995 | Sayka | 361/103 |
| 5,506,167 A | * | 4/1996 | Chen et al. | 438/238 |
| 5,750,435 A | | 5/1998 | Pan | 438/525 |
| 5,891,792 A | | 4/1999 | Shih et al. | 138/525 |
| 6,054,386 A | * | 4/2000 | Prabhakar | 438/682 |
| 6,063,672 A | | 5/2000 | Miller et al. | 438/275 |
| 6,198,135 B1 | | 3/2001 | Sonoda | 257/355 |
| 6,229,183 B1 | * | 5/2001 | Lee | 257/360 |

OTHER PUBLICATIONS

Wolf et al., "Silicon Processing for the VLSI era" vol. 1, Lattice Press, 1986, pp. 299–305.*

* cited by examiner

*Primary Examiner*—Amir Zarabian
*Assistant Examiner*—Jeff Vockrodt
(74) *Attorney, Agent, or Firm*—Haynes and Boone, LLP

(57) ABSTRACT

The problem of gate oxide damage as a result of electrostatic discharges has been overcome by including within the drain of the ESD protection device a region having very high defect density. Its depth within the drain is such that no action occurs when applied voltages are low. However, when a high voltage is applied, the depletion layer grows wide enough to touch this region thereby allowing substantial current flow into the substrate which results in lowering the voltage to a safe level. The high defect density region is formed through ion implantation of relatively heavy ions such as germanium. This is done after completion of the normal manufacturing process including SALICIDATION, no significant heating of the device after that being permitted.

6 Claims, 2 Drawing Sheets

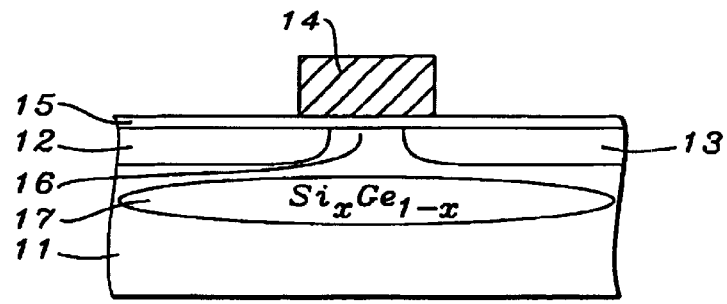
FIG. 1a – Prior Art
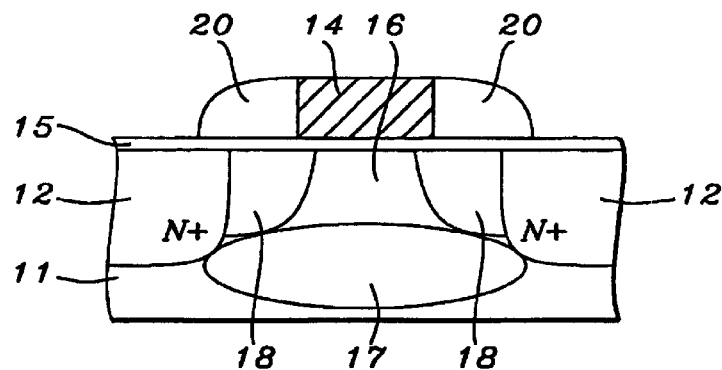
FIG. 1b – Prior Art
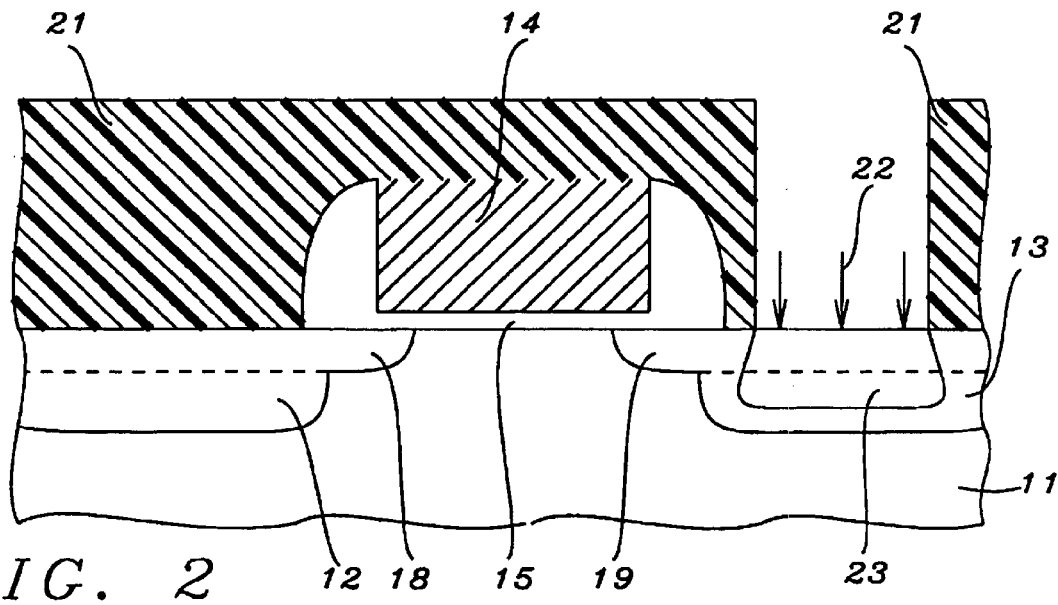
FIG. 2

ELECTROSTATIC DISCHARGE DEVICE PROTECTION STRUCTURE

FIELD OF THE INVENTION

The invention relates to the general field of device protection against ESD (Electrostatic Discharge).

BACKGROUND OF THE INVENTION

Because of the fragility of the gate oxides in FET devices, they have always been susceptible to damage by unintended application of high voltages across them. High voltages of this type can easily occur as a result of electrostatic charge buildup and uncontrolled release. The solution to this problem has been to provide a path for the ESD that plays no role during normal circuit operations but that diverts the ESD whenever it appears and does so at a rapid enough rate for the gate oxide to remain unaffected. ESD transistors of the this type are normally connected to the input and output pins of the chip and divert any ESD that may occur into the substrate or similar electrical sink.

A common method for bypassing ESDs around the gate is to place the source and drain regions close enough together for current to be able to pass directly between them whenever the applied voltage is great enough to be a threat to the gate oxide. More commonly, the physical separation between source and drain is not changed but, rather, the electrical resistance between them is reduced.

For example, as illustrated in FIG. 1a, in U.S. Pat. No. 5,891,792, Shih et al. implant Ge ions at an angle to form a buried SiGe alloy electrode 17 under gate 14. Also shown in the figures are gate oxide 15, source and drain 12 and 13, and channel region 16. FIG. 1b schematically shows the device for the particular case of an LDD (lightly doped drain) device. Seen there are lightly doped drain areas 18 and 19 as well as insulating spacers 20. In the immediate vicinity of the gate the source and drain just make contact with the buried SiGe layer 17.

U.S. Pat. No. 6,198,135 B1 (Sonoda) takes a similar approach by providing a top layer of SiGe within which the device is formed, while Miller in U.S. Pat. No. 6,063,672 simply provides a low resistivity area immediately below the device.

In related art (U.S. Pat. No. 5,750,435), Pan implants hardening ions (nitrogen or fluorine) into the gate oxide near the gate outer edges. This reduces hot carrier effects. Aujum et al. (U.S. Pat. No. 5,360,749) implant germanium ions at the channel edges to minimize short channel effects.

SUMMARY OF THE INVENTION

It has been an object of at least one embodiment of the present invention to provide an ESD protection device.

Another object of at least one embodiment of the present invention has been to provide a process for manufacturing said device.

Still another object of at least one embodiment of the present invention has been that said process be fully compatible with existing FET manufacturing processes.

These objects have been achieved by including within the drain of the ESD protection device a region having very high defect density. Its depth within the drain is such that no action occurs when applied voltages are low. However, when a high voltage is applied, the depletion layer grows wide enough to touch this region thereby allowing substantial current flow into the substrate which results in lowering the voltage across the gate oxide to a safe level. The high defect density region is formed through ion implantation of relatively heavy ions such as germanium. This is done after completion of the normal manufacturing process including SALICIDATION, no significant heating of the device after that being permitted.

BRIEF DESCRIPTION OF THE DRAWINGS

FIGS. 1a and 1b illustrate a prior art approach to the design of an ESD protection device.

FIG. 2 illustrates the process for manufacturing the structure of the present invention.

DESCRIPTION OF THE PREFERRED EMBODIMENTS

Figure 3:
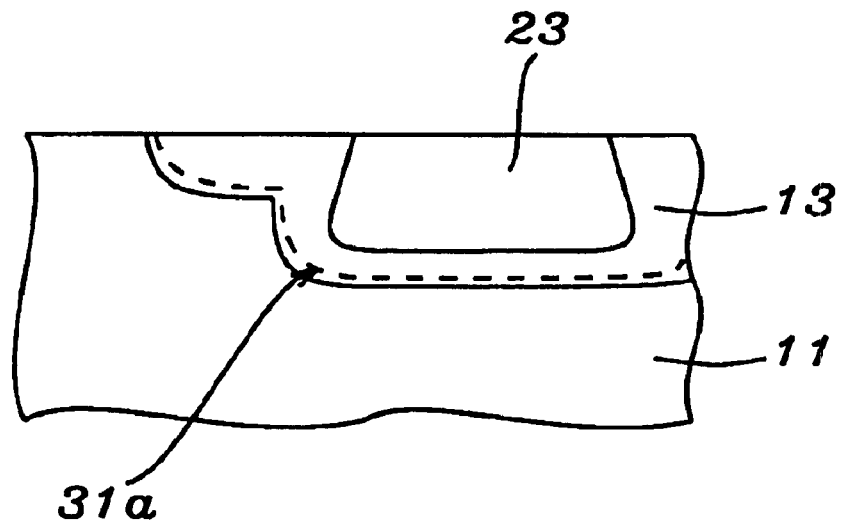
FIG. 3 shows the position of the depletion layer in the drain during normal operation of the device.

Referring now to FIG. 2 we describe a process for the manufacture of the present invention. Said process may be applied to the manufacture of either N-channel or P-channel devices. In the course of this description, the structure of the present invention will also become clear. The process begins with the provision of silicon substrate 11 on which is formed oxide layer 15. Then, a polysilicon layer is deposited and patterned and etched (together with the uncovered portions of the oxide layer) to form gate pedestal 14.

Lightly doped source and drain regions 18 and 19 are then formed through ion implantation. These extend downwards and abut both sides of gate pedestal 14. They have a dopant concentration. Next, insulating spacers 20 are formed on only the vertical sides of gate pedestal 14 and a second ion implantation step is undertaken, this time forming heavily doped source and drain regions 12 and 13 which abut the spacers and extend downwards to a greater depth than that of the lightly doped regions 18 and 19.

At this point the standard prior art process for a LDD structure would be complete except for forming contacts to the gate, source, and drain using the standard SALICIDE process. This is now done for all devices on the wafer with the exception of the ESD protection devices themselves. Once the various heat treatments associated with the SALICIDE process have been completed, mask 21 is applied to the structure. This protects all areas on the wafer except for the drain regions of the ESD protection devices.

Then, an additional ion implantation step (shown schematically as arrows 22) is implemented. Our preferred ionic species for this has been germanium but, more generally, any relatively heavy ions having an atomic weight greater than about 10, could have been used instead. The result is that high defect concentration region 23 is formed in the unprotected drain regions.

Figure 4:
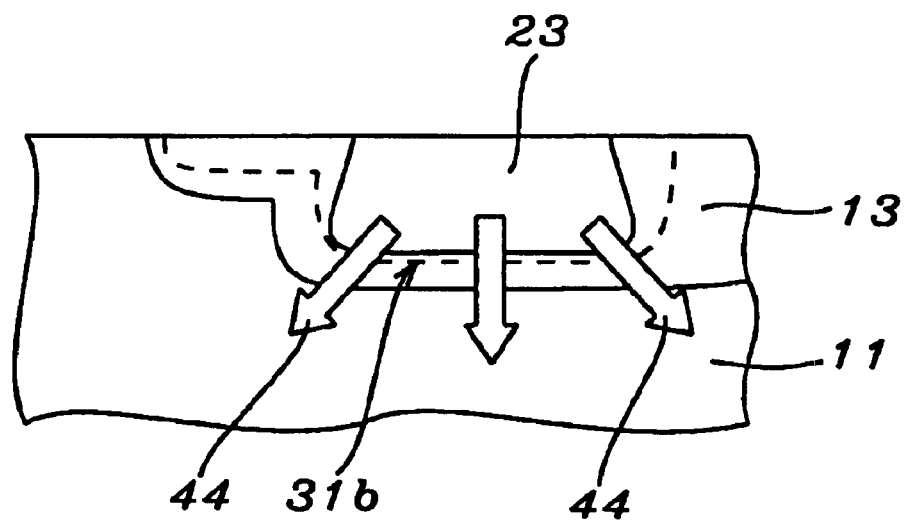
FIG. 4 shows how, with the application of dangerously high voltage, the depletion layer touches the high defect layer (a key feature of the present invention) which allows voltage to be drawn away from the gate oxide.

This high defect concentration region represents the heart of the present invention since it is the basis for the operation of the device as a protection against electrostatic discharges. When the device is operating under normal conditions, only moderate voltages will be applied to the gate. Under these conditions the depletion layer 31a, will penetrate into the drain only a relatively small amount, as shown in FIG. 3, but when a high voltage is applied to the drain (which will have been connected to either an input or an output of the chip on which it resides), the depletion layer will penetrate much further into the drain as shown by 31b in FIG. 4.

Of itself, this deeper penetration by the depletion layer into the drain does nothing to protect the gate oxide which will also be subjected to the higher voltage and thus be destroyed. However, high defect density region 23 allows a much higher current to flow from the drain into the depletion layer, and thence into the substrate, than is possible with a conventional device. High current densities are possible. This high current flow immediately causes the voltage across the other devices on the chip to drop, thereby preventing destruction of their gate oxide layers.

It should be noted since region 23 depends for its effectiveness on retaining a high defect concentration any heat treatment that anneals out said defects will be counterproductive. A good rule is to always maintain the structure at a temperature less than about 200° C. for the remainder of its useful life.

What is claimed is:

1. A process for manufacturing an ESD device protection structure for use on a chip, comprising:

providing a field effect transistor having a source region and a drain region having a first depth;

applying a mask that protects all areas except said drain region, then implanting ions having an atomic weight greater than about 10, said ions penetrating to a depth that is less than said first depth, thereby forming in said drain region a high defect region, having a second depth;

removing said mask;

maintaining said structure at a temperature that is less than about 200° C. for the remainder of its useful life; and when a voltage is applied that causes a depletion layer in said drain region to penetrate to a depth between said first and second depths, said high defect region allowing passage of a current that is sufficient to immediately cause voltages across other devices on the chip to drop and to thereby prevent their destruction.

2. The process of claim 1 wherein said implanted ions are germanium.

3. The process of claim 1 wherein, during implantation, said ions comprise a beam that applies a dose of ions between about $10^{13}$ and $10^{14}$ ions per $cm^2$.

4. A process for manufacturing an ESD device protection structure, for use on a chip, comprising:

providing a body of silicon, having a surface, and forming thereon a layer of oxide;

depositing a layer of polysilicon on said oxide layer and then patterning and etching said layers of oxide and polysilicon to form a gate pedestal, having two opposing sides, on a gate oxide;

through a first ion implant, forming lightly doped source and drain regions extending downwards from said surface, abutting both sides of said gate;

forming insulating spacers only on said gate pedestal sides;

through a second ion implant, forming heavily doped source and drain regions abutting said spacers and extending downwards from said surface to a depth greater than that of said lightly doped regions;

applying a mask that protects all areas except said drain region, then through a third ion implant, implanting ions having an atomic weight greater than about 10, said ions penetrating below said surface to a depth that is less than the depth of the drain region, thereby forming in said drain region a high defect region;

maintaining said structure at a temperature less than about 200° C. for the remainder of its useful life; and when an ESD voltage is applied, causing a depletion layer in said drain region to penetrate said high defect region, thereby allowing passage of a current that is sufficient to immediately cause voltages across other devices on the chip to drop and thereby prevent their destruction.

5. The process of claim 4 wherein said third ion implantation further comprises implanting germanium.

6. The process of claim 4 wherein said third ion implantation further comprises using a beam that applies a dose of ions between about $10^{13}$ and $10^{14}$ ions per $cm^2$.

* * * * *